United States Patent [19]

Proscia et al.

[11] Patent Number: 5,324,537
[45] Date of Patent: Jun. 28, 1994

[54] GASEOUS DOPING OF TUNGSTEN OXIDE

[75] Inventors: James W. Proscia, Dearborn; Umar Riaz, Ann Arbor, both of Mich.

[73] Assignee: Ford Motor Company, Dearborn, Mich.

[21] Appl. No.: 86,796

[22] Filed: Jul. 6, 1993

[51] Int. Cl.$^5$ .............................................. B05D 5/12
[52] U.S. Cl. .................................... 427/109; 427/108; 427/126.2; 427/126.3; 427/165; 427/166; 427/255; 427/255.7; 427/343; 204/192.26; 204/192.27; 204/192.24; 204/192.29
[58] Field of Search ............ 427/109, 108, 255, 255.7, 427/166, 343, 444, 126.2, 126.3, 165; 204/192.27, 192.26, 192.29, 192.28

[56] References Cited

U.S. PATENT DOCUMENTS

| | | | |
|---|---|---|---|
| 3,457,106 | 7/1922 | Gillery | 427/109 |
| 4,172,159 | 10/1979 | Marcault | 427/110 |
| 4,746,549 | 5/1988 | Ito et al. | 427/255.1 |
| 5,102,691 | 4/1992 | Russo et al. | 427/109 |

*Primary Examiner*—Janyce Bell
*Attorney, Agent, or Firm*—Lorraine S. Melotik; Roger L. May

[57] ABSTRACT

The procsses disclosed is for preparing a film of fluorine-modified tungsten oxide on a substrate. The process comprises providing a tungsten oxide film on the substrate and then exposing the tungsten oxide film at an elevated temperature to a stream of a gaseous fluorocarbon. The exposure takes place for a time sufficient to modify the tungsten oxide with fluorine and form a film having modified infrared adsorption and reflectant properties.

8 Claims, No Drawings

GASEOUS DOPING OF TUNGSTEN OXIDE

FIELD OF THE INVENTION

This invention relates generally to a process for preparing a blue colored, infrared absorbing, electrically conductive film of fluorine-modified tungsten oxide on the surface of a substrate by exposing, at an elevated temperature, a previously deposited tungsten oxide layer to a gaseous fluorocarbon compound.

BACKGROUND OF THE INVENTION

It is well known in the glass art to coat glass sheets with metallic and/or dielectric materials, to impart enhanced solar and optical properties to the glass sheets. For example, it is known to place multiple films (layers) of metals and dielectrics onto glass to produce electrically conductive coatings which are transparent to visible light and highly reflective to infrared radiation. It is also known to deposit conductive metal oxides onto glass, such as, for example, fluorine-doped tin oxide, which are also highly reflective to infrared radiation.

Tungsten oxide is a transparent semi-conductor, which when doped with a material such as fluorine shows an appreciable increase in the infra-red absorption and reflection. Hence, such doped tungsten oxide films, e.g., when applied to glass substrates, are potential candidates for solar control applications.

Many conventional methods for depositing coatings onto glass sheets are known. Examples of conventional deposition processes include liquid or power spray pyrolysis, wherein liquids or solid particles containing film forming reactants are sprayed onto the surface of a hot glass ribbon being produced by the well-known float glass process. A more convenient method for depositing coatings onto glass is by way of chemical vapor deposition (CVD), wherein vaporized film-forming precursors are reacted at or near the surface of a hot glass ribbon to form the metal or dielectric film thereon. Chemical vapor deposition does not suffer from the problems associated with either liquid or power spray pyrolysis processes. That is, a liquid spray pyrolysis process substantially cools the hot glass ribbon, while power spray pyrolysis requires a complex, delicate powered handling and delivery system.

Tungsten oxide films are doped with fluorine by including a fluorinated compound as one of the reactants used in, e.g., the pyrolysis or CVD processes. Once such method for forming a fluorine doped tungsten oxide film on glass is disclosed in U.S. application Ser. No. 07/806,177 entitled "Preparation of Fluorine-Doped Tungstic Oxide" filed Dec. 13, 1991 to Proscia, commonly assigned with the present invention. It discloses forming a coating on glass by reacting at the surface of the glass at elevated temperature: tungsten hexafluoride, and an oxygen containing compound, and a fluorine compound.

It would be desirable to prepare a fluorine-modified tungsten oxide film having the above properties by a process which comprises subjecting an already applied film of tungsten oxide to a fluorine material. Such a process advantageously would allow for the use of techniques such as sputtering, which are particularly suitable for coating curved pieces of glass, to be used to apply the tungsten oxide coating on the substrate. Sputtering equipment is not generally compatible with fluorine-containing compounds.

SUMMARY OF THE INVENTION

According to the present invention, a novel process is disclosed for preparing a fluorine-modified tungsten oxide. The process comprising depositing a tungsten oxide film on a substrate and subsequently exposing the film, at an elevated temperature, to a stream of a gaseous fluorocarbon compound for a time sufficient to decompose the compound and fluorine-modify the tungsten oxide. According to the present process, the resultant fluorine-modified tungsten oxide film has modified infrared absorption and reflection properties. The gaseous fluorocarbon compound can be provided diluted with other gases such as nitrogen or air when it is exposed to the tungsten oxide film on the substrate.

DETAILED DESCRIPTION OF THE PREFERRED EMBODIMENTS

The invention is directed to a process for preparing a film of fluorine-modified tungsten oxide on a substrate. The resultant film is a blue-colored, infrared absorbing and/or reflecting, electrically conductive layer.

As disclosed above, the first step of the process comprises depositing a tungsten oxide film on a substrate. The substrate may be any such material which would benefit from the application of a film which would provide an increase in the infrared adsorption and reflection properties. Exemplary of such substrates are glass, quartz, and saphire. Particularly useful glasses include soda-lime-silica glass, such as those used as automotive and architectural glazings, conveniently produced by the well-known float glass process. Other suitable glasses useful in this invention include, but are not limited to, borosilicate glass, boroaluminosilicate glass, alkali-lime-silica glass, aluminosilicate glass, phosphate glass, fused silica, and the like.

The tungsten oxide film may be deposited on the substrate by any suitable method including such conventional deposition techniques as, e.g., sputtering, chemical vapor deposition (CVD) and the spray method. As would be apparent to those skilled in the art in view of the present disclosure, the tungsten source employed in such methods will vary with the technique used. The process of depositing a film of tungsten oxide according to sputtering generally involves the application of a radio frequency voltage to a solid tungsten metal target exposed to an oxygen-containing atmosphere at reduced pressure. *Glow Discharge Process* by B. Chapman is hereby expressly incorporated by reference for its teachings of sputtering techniques Another useful film deposition technique which may be employed to deposit a tungsten oxide film according to the present invention, is the well-known CVD process. It generally involves the flowing of gaseous reactants, one of which is a tungsten compound such as tungsten carbonyl, over a heated substrate. *Thin Film Processes* edited by J. L. Vossen and Werner Kern is herein expressly incorporated by reference for its teaching of such a process. Still other useful processes for depositing the tungsten oxide film on the surface of the substrate will be apparent to those skilled in the art in view of the present disclosure. The temperature of the substrate during the deposition process may vary and is not critical to the invention. For example, the tungsten oxide film may be deposited at room temperature or at an elevated temperature, the latter being the case when such films are deposited on a hot glass ribbon being produced by the well-known float glass process. The latter may involve temperatures in the range of 80° C. to about 700° C.

Generally, the tungsten oxide film is deposited on the substrate in a thickness of preferably between about 200 and 6000Å. The desired thickness of the film is determined by various factors, including reactant concentrations temperature and substrate velocity.

The fluorocarbon doping agent may be selected from any fluorocarbon compound which can be provided in gaseous form and, at elevated temperatures, can decompose to provide fluorine atoms to the deposited tungsten oxide film. Generally, and preferably, such useful compounds should be reactive in the temperature range of about 300 and about 700° C., more preferably in the range of 300-500° C. The preferred temperature range will, in part, be determined by the composition of the substrate, the particular compound employed, and the type of process used. For example, in modifying a tungsten oxide film which has been applied to glass, the decomposition temperature of the fluorocarbon compound is preferably in the range of about 350° C.–450° C., more preferably 400° C. to about 425° C., since this is the annealing temperature of conventional float glass. It is understood that it would be desirable in such a situation to apply the tungsten oxide film on the glass as it is produced according to the float glass process and subsequently. while the glass is still at this elevated temperature, to expose the film to a gaseous stream of the fluorocarbon compound in order to modify the film with fluorine.

The fluorocarbon compound useful in this invention to modify the film may be selected from, but is not limited to, 1,1-difluoroethylene, difluoroethane, hexafluoroethane, sulfur hexafluoride, nitrogen trifluoride, bromotrifluoro-methane, trifluorolethanol, ethyl trifluoroacetate, chlorotrifluoroethylene and the like. Compatible mixtures of various fluorocarbon compounds are also suitable as the fluorocarbon compound. Preferably the fluorocarbon modified is difluoroethane or difluoroethylene.

According to the process of the present invention, and after the tungsten oxide film has been deposited on the substrate, the film is exposed to the gaseous fluorocarbon compound at an elevated temperature and for a time sufficient fluorine-modify the film. This modified film has modified infrared absorption and reflection properties. The elevated temperature is not critical and can vary widely, as will be appreciated by those skilled in the art in view of this disclosure, since it relates to the decomposition temperature of the gaseous fluorocarbon compound. When doping a tungsten oxide film which has been deposited on glass, the compound would be selected so that this elevated temperature preferably would be in the range of about 300-500° C. The time required for the doping to occur will vary and is not sharply critical, usually being in the range of about several seconds to several minutes at such elevated temperatures.

In order to expose the deposited tungsten oxide film to the compound, it is provided in a gas stream which is flowed over the tungsten oxide film. The gaseous fluorocarbon compound can be diluted in the gas stream with other gases such as nitrogen, air or helium, when it is provide over the tungsten oxide film. Preferably, the concentration of the fluorocarbon compound doping agent be at least about 1 percent of the gaseous stream, preferably be in the range of between about 1 and about 100 percent of the gas stream. The concentration could vary and would depend in part on the composition of the compound, including the ratio of fluorine in the compound.

The fluorocarbon compound may be available in any form, e.g., solid or liquid, and converted to a gaseous compound by any conventional procedure known to be useful for generating vaporized reactants such as, for example, the thermal vaporization of a liquid reactant, the vaporization of a dispersed or fluidized reactant powder in a hot inert carrier gas stream, the bubbling of an inert carrier gas through a liquid reactant, etc. Inert carrier gases include, but are not necessarily limited to, helium, nitrogen, hydrogen, argon, and the like, as well as mixtures thereof.

Conveniently, according to the inventive process, a low pressure process such as sputtering can be employed to first provide the tungsten oxide film on the glass. Alternately, if the film is to be applied to a hot glass ribbon being produced by the float glass process, chemical vapor deposition, preferably atmospheric pressure chemical vapor depositon, would advantageously be used. In the latter situation, if the fluorocarbon modifier is then conveyed to the surface of the hot glass ribbon, the decomposition of the fluorocarbon takes place near the film surface as a result of the heat retained by the glass ribbon. The deposited tungsten oxide film is, as a result, modified forming a film which has modified infrared absorption and reflective properties. Though no wanting to limit scope of the invention to a specific mechanism of modification, it is suspected that the tungsten oxide films in the present invention become doped with fluorine atoms. In the case of glass coated in this fashion, it may be used to manufacture electrically conductive, infrared reflecting and/or absorbing automotive and architectural glazing. Such glass has a blue tinted appearance.

EXAMPLE 1

A fluorine-modified tungsten oxide film is made according to an embodiment of the present invention in this example. A 3000 Å film of fluorine-doped tungsten oxide first is deposited on a glass substrate heated to 350° C. using a sputtering technique and tungsten as a source. A mixture of difluoroethane and nitrogen is flowed over the tungsten oxide coated side of the glass. A flow rate of 400 cc/min is used for the difluoroethane and a flow rate of 200 cc/min is used for the nitrogen. The flow is continued for five minutes, at which time the film color turns from clear to blue and it has increased infrared absorption.

EXAMPLE 2

The procedure of Example 1 is followed except that the tungsten oxide film is deposited by chemical vapor deposition techniques using tungsten (V) ethoxide. The resultant film has increased infrared absorption.

EXAMPLE 3

The procedure of Example 1 is repeated except that the difluoroethane is mixed with air. The resultant film has increased infrared absorption.

We claim:

1. A process for preparing a blue colored infrared absorbing fluorine-modified tungsten oxide film on a substrate, which process comprises:
   depositing a tungsten oxide film on said substrate; and exposing said film at an elevated temperature between about 300° C. and 700° C. to a stream of a gaseous fluorocarbon compound for a time sufficient to modify said tungsten oxide film with fluorine so as to form a fluorine-modified tungsten oxide film having modified infrared absorption and reflectant properties.

2. The process according to claim 1, wherein said tungsten oxide film is provided on the substrate by sputtering or chemical or vapor deposition.

3. The process according to claim 1, wherein the fluorocarbon compound is selected from difluoroethane and difluoroethylene.

4. The process according to claim 1, wherein said substrate is glass.

5. The process according to claim 4, wherein the elevated temperature is one between about 300° C.–500° C.

6. The process according to claim 1, wherein said gaseous fluorocarbon compound is diluted with nitrogen or air.

7. A process for coating glass, comprising the steps of:
A) providing a glass substrate having a surface film of tungsten oxide; and
B) exposing said film at an elevated temperature between about 300° C. and 700° C. to a stream of a gaseous fluorocarbon compound for a time sufficient to modify said tungsten oxide film with fluorine and form a fluorine-modified tungsten oxide film having modified infrared absorption and reflectant properties.

8. A process for preparing a blue tinted, electrically conductive, infrared radiation reflecting coated glazing for automotive or architectural use, comprising the steps of:
A) providing a glass substrate having a surface film of tungsten oxide; and
B) exposing said film at a temperature between about 300° C.–500° C. to a fluorine-containing compound selected from difluoroethylene and hexafluoroethane for a time sufficient to form a fluorine-modified tungsten oxide film having modified infrared adsorption and reflectance properties.

* * * * *